(12) United States Patent
Koshimura et al.

(10) Patent No.: US 6,280,905 B1
(45) Date of Patent: Aug. 28, 2001

(54) PHOTOSENSITIVE RESIN COMPOSITION

(75) Inventors: Katsuo Koshimura; Tsukasa Toyoshima; Takashi Nishioka; Tadaaki Tanaka, all of Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/556,528

(22) Filed: Apr. 21, 2000

(30) Foreign Application Priority Data

Apr. 22, 1999 (JP) .................................................. 11-114650

(51) Int. Cl.$^7$ .............................. G03F 7/032; C08F 2/46
(52) U.S. Cl. ..................... 430/281.1; 430/287.1; 430/907; 430/915; 430/922; 430/923; 430/924; 522/110; 522/114
(58) Field of Search ............................. 430/281.1, 287.1, 430/907, 915, 922, 923, 924; 522/110, 114

(56) References Cited

U.S. PATENT DOCUMENTS

| 4,895,788 | 1/1990 | Walls et al. ........................... 430/278 |
| 5,731,129 | 3/1998 | Koshimura et al. ............... 430/286.1 |
| 5,736,298 | 4/1998 | Koshimura et al. ............... 430/287.1 |
| 5,861,232 | * 1/1999 | Kanda et al. ....................... 430/281.1 |

FOREIGN PATENT DOCUMENTS

| 36 04 402 | 8/1986 | (DE) . |
| 0 607 962 | 7/1994 | (EP) . |
| 0 718 695 | 6/1995 | (EP) . |
| 0 675 412 | 10/1995 | (EP) . |
| 0 864 927 | 9/1998 | (EP) . |
| 1-049036 | 2/1989 | (JP) . |
| 7-134411 | 5/1995 | (JP) . |
| 7-140655 | 6/1995 | (JP) . |

OTHER PUBLICATIONS

Derwent Publications, AN 1994–305701, JP 06 230573, Aug. 19, 1994.
Derwent Publicactions, AN 1989–102954, JP 01 049036, Feb. 23, 1989.

* cited by examiner

*Primary Examiner*—Rosemary E. Ashton
(74) *Attorney, Agent, or Firm*—Oblon, Spivak, McClelland, Maier & Neustadt, P.C.

(57) ABSTRACT

A photosensitive resin composition which comprises (1) a particulate copolymer comprising 10–99.8% by mole of the unit of (i) an aliphatic conjugated diene monomer, 0.1–30% by mole of the unit of (ii) a monomer having one polymerizable unsaturated group and an amino group, 0.1–20% by mole of the unit of (iii) a monomer having at least two polymerizable unsaturated groups and 0–40% by mole of the unit of (iv) a copolymerizable other monomer having one polymerizable unsaturated group, (2) a photopolymerizable unsaturated monomer and (3) a photopolymerization initiator typically represented by 9-fluorenone or 2-i-propylthioxanthone.

A photosensitive resin composition is provided which can be developed by using water, has a low hardness and high resilience, and is excellent in balance of properties.

15 Claims, No Drawings

PHOTOSENSITIVE RESIN COMPOSITION

BACKGROUND OF THE INVENTION

The present invention relates to a photosensitive resin composition which can be developed by using water. In more particular, it relates to a photosensitive resin composition which has a low hardness, and high resilience and is useful as a material for a photosensitive printing plate, and the like.

Photosensitive resin compositions have hitherto been widely used for photoresist, ink, printing plates, etc. However, many of such photoresist and printing plates require the use of organic solvents at the time of developing. In recent years, however, in addition to the problems of safety and health in process operations, the adverse influence of organic solvents on environment has become a serious problem, so that photosensitive resin composition which can be developed more safely by using water are eagerly desired. To meet such needs, photosensitive resin compositions have been proposed which use as a base material water-soluble polymers, e.g., poly(vinyl alcohol), gelatin and casein.

However, previous water-developable photosensitive resin compositions have a strongly polar hydroxyl group, amide group, or the like, so that photo-cured products resulting from the compositions have a high hardness and a low resilience. Accordingly these compositions are not suited for such uses as, for example, printing on the surface of a flexible packaging material.

SUMMARY OF THE INVENTION

In view of the situations, the object of the present invention is to provide a photosensitive resin composition which can be developed with water, has a low hardness and high resilience and is excellent in balance of properties.

According to the present invention, there is provided a photosensitive resin composition which comprises (1) a particulate copolymer comprising, as the repeating units in the copolymer, 10–99.8% by mole of the unit of (i) an aliphatic conjugated diene monomer, 0.1–30% by mole of the unit of (ii) a monomer having a polymerizable unsaturated group and an amino group, 0.1–20% by mole of the unit of (iii) a monomer having at least two polymerizable unsaturated groups and 0–40% by mole of the unit of a copolymerizable other monomer having one polymerizable unsaturated group, the total of the units of the monomers (i), (ii), (iii) and (iv) being 100% by mole, (2) a photopolymerizable unsaturated monomer, and (3) at least one photopolymerization initiator selected from the group of the compounds represented by the following formulas (I) and (II),

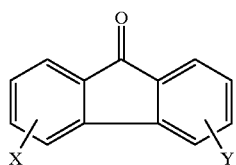

(I)

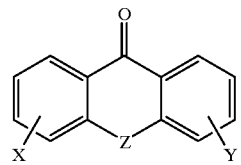

(II)

wherein X and Y are each independently a hydrogen atom, halogen atom, carboxyl group, monovalent hydrocarbon group having 1–20 carbon atoms or alkoxyl group having 1–20 carbon atoms and Z is an oxygen atom or sulfur atom.

DETAILED DESCRIPTION OF THE INVENTION

The present invention is described in detail below.

(1) Particulate Copolymer

The particulate copolymer, one of the constituents of the photosensitive resin composition of the present invention, may be prepared by emulsion-polymerizing or suspension-polymerizing a monomer mixture which comprises, as the essential components, (i) an aliphatic conjugated diene monomer (hereinafter referred to as "monomer (i)"), (ii) a monomer having one polymerizable unsaturated group and an amino group (hereinafter referred to as "monomer (ii)") and (iii) a monomer having at least two polymerizable unsaturated groups (hereinafter referred to as "monomer(iii)") and, if necessary, additionally (iv) a copolymerizable other monomer having one polymerizable unsaturated group (hereinafter referred to as "monomer(iv)").

Examples of the monomer (i) include 1,3-butadiene, isoprene, 2,3-dimethyl-1,3-butadeine and chloroprene, 1,3-butadiene and isoprene being preferred. These monomers (i) may be used each alone or in a combination of two or mere thereof.

In the repeating units in the particulate copolymer, the content of the monomer (i) unit is 10–99.8% by mole, preferably 30–90% by mole. When the content of the monomer (i) unit is less than 10% by mole, the resulting composition tends to have a decreased strength after photo-curing; when the content is higher than 99.8% by mole, the resulting composition tends to be poor in water-developability.

The monomer (ii) is preferably a monomer having a tertiary amino group, examples of which include N,N'-dialkylaminoalkyl acrylates or methacrylates, such as N,N'-dimethylaminomethyl acrylate and methacrylate, N,N'-diethylaminomethyl acrylate and methacrylate, N,N'-2-dimethylaminoethyl acrylate and methacrylate,N,N'-2-diethylaminoethyl acrylate and methacrylate,N,N'-2-(di-n-propylamino) ethyl acrylate and methacrylate N,N'-2-dimethylaminopropyl acrylate and methacrylate, N,N'-2-diethylaminopropyl acrylate and methacrylate, N,N'-2-(di-n-propylamino)-propyl acrylate and methacrylate, N,N'-3-dimethylamino-propyl acrylate and methacrylate, N,N'-3-diethylamino-propyl acrylate and methacrylate, and N,N'-3-(di-n-propylamino) propyl acrylate and methacrylate; N,N'-dialkylamino-alkyl group-containing unsaturated amides, such as N,N'-dimethylaminomethyl acrylamide and methacrylamide, N,N'-diethylaminomethyl acrylamide and methacrylamide, N,N'-(2-dimethylaminoethyl)acrylamide and methacrylamide, N,N'-(2-diethylaminoethyl)acrylamide and methacrylamide, N,N'-(2-dimethylaminopropyl)

acrylamide and methacrylamide, N,N'-(2-diethylaminopropyl)acrylamide and methacrylamide, N,N'-(3-dimethylaminopropyl)acrylamide and methacrylamide, and N,N'-(3-diethylaminopropyl)acrylamide and methacrylamide; and vinylaromatic compounds having a tertiary amino group, such as N,N'-dimethyl-p-aminostyrene, N,N'-diethyl-p-aminostyrene and vinylpyridine; preferred of these being N,N'-dimethylaminoethyl methacrylate and N,N'-diethylaminoethyl methacrylate. These monomers having a tertiary amino group may be used each alone or in a combination of two or more thereof.

In the repeating units in the particulate copolymer the content of the monomer (ii) unit is 0.1–30% by mole, preferably 0.5–20% by mole. When the content of the monomer (ii) unit is less than 0.1% by mole, the resulting composition tends to be poor in water-developability; when the content is higher than 30% by mole, the resulting composition tends to be hard and brittle.

Examples of the monomer (iii) include ethylene glycol diacrylate and dimethacrylate, propylene glycol diacrylate and dimethacrylate, 1,4-butanediol diacrylate and dimethacrylate, 1,6-hexanediol diacrylate and dimethacrylate, trimethylolpropane diacrylate and dimethacrylate, trimethylolpropane triacrylate and trimethacrylate, pentaerythritol triacrylate and trimethacrylate, pentaerythritol tetraacrylate and tetramethacrylate, divinylbenzene, diisopropenylbenzene and trivinylbenzene; preferred of these being ethylene glycol diacrylate and dimethacrylate, and divinylbenzene.

These monomers (iii) may be used each alone or in a combination of two or more thereof.

In the repeating units in the particulate copolymer, the content of the monomer (iii) unit is 0.1–20% by mole, preferably 0.5–10% by mole. When the content of the monomer (iii) unit is less than 0.1% by mole, the resulting composition tends to be poor in water-developability; when the content is higher than 20% by mole, the particulate copolymer tends to be poorly compatible with the photopolymerizable unsaturated monomer (2), resulting in poor processability of the composition, and the composition tends to have a greatly decreased strength after photo-curing.

The monomer (iv) is not particularly limited so long as it is a copolymerizable compound having one polymerizable unsaturated group. Example thereof include styrene, α-methylstyrene, o-vinyltoluene, m-vinyltoluene, p-vinyltoluene, acrylonitrile, methacrylonitrile, vinylidene cyanide, vinyl chloride, vinylidene chloride, acrylamide, methacrylamide, maleimide, methyl acrylate and methacrylate, ethyl acrylate and methacrylate, n-propyl acrylate and methacrylate, i-propyl acrylate and methacrylate, n-butyl acrylate and methacrylate, i-butyl acrylate and methacrylate, sec-butyl acrylate and methacrylate, t-butyl acrylate and methacrylate, n-amyl acrylate and methacrylate, n-hexyl acrylate and methacrylate, 2-ethylhexyl acrylate and methacrylate, and cyclohexyl acrylate and methacrylate.

These monomers (iv) may be used each alone or in a combination of two or more thereof.

In the repeating unit in the particulate copolymer, the content of the monomer (iv) unit is 0–40% by mole. When the content of the monomer (iv) unit is higher than 40% by mole, the resulting composition tends to have a greatly decreased elasticity; this is unfavorable.

The particulate copolymer can be prepared either by an emulsion polymerization method or by a suspension polymerization method, both using a radical initiator, but an emulsion polymerization method is preferred from the viewpoints of particle size and particle size uniformity.

The radical initiators which may be used are, for example, organic peroxides, such as benzoyl peroxide, lauroyl peroxide, t-butyl hydroperoxide, cumene hydroperoxide, p-methane hydroperoxide, di-t-butyl peroxide, and dicumyl peroxide; diazo compounds typically represented by azobisisobutyronitrile; inorganic peroxides typically represented by potassium persulfate; and redox-type catalysts typically represented by the combination of these peroxides with ferrous sulfate.

These radical initiators may be used each alone or in a combination of two or more thereof.

The emulsifier used in the emulsion polymerization may be, for example, an anionic surfactant, nonionic surfactant, cationic surfactant and amphoteric surfactant. These surfactants may also be a fluorine-containing one.

These emulsifiers may be used each alone or in a combination of two or more thereof.

Examples of suspension stabilizers used in the suspension polymerization include poly (vinyl alcohol), sodium polyacrylate and hydroxyethyl cellulose.

These suspension stabilizers may be used each alone or in a combination of two or more thereof.

In the emulsion polymerization and the suspension polymerization, the polymerization reactants, i.e., respective monomers, radical initiators, etc, may be added all at once at the time of initiation of the reaction or may be added continuously or stepwise after initiation of the reaction. The polymerization is conducted in a reactor from which oxygen has been removed usually at 0–80° C., but the operation conditions as temperature and stirring may be changed appropriately as desired during the reaction. The method of polymerization may be either a continuous one or a batch type one.

The water resistance and the water-developing property of the photosensitive resin composition can be further improved by making the particle surface of the particulate copolymer hydrophilic and making the inside of the particle hydrophobic.

The number average particle diameter of the particulate copolymer is preferably 5–1500 nm, more preferably 10–1000 nm still more preferably 20–500 nm, particularly preferably 30–300 nm. When the number average particle diameter of the particulate copolymer is less than 5 nm, the water-developability tends to deteriorate; when the diameter is larger than 1,500 nm, the processability of the resin composition tends to be poor.

In the present invention, the particulate copolymer may be used either singly or as a mixture of two more kinds thereof.

(2) Photopolymerizable Unsaturated Monomer

The photopolymerizable unsaturated monomer, one of the constituents of the photosensitive resin composition of the present invention is not particularly limited so long as it can be polymerized by light irradiation in the presence of (3) a photopolymerization initiator described later. Examples thereof include:

vinyl aromatic compounds, such as styrene, α-methylstyrene, o-vinyltoluene, m-vinyltoluene, p-vinyltoluene, p-t-butylstyrene, o-methoxystrene, m-methoxystyrene, p-methoxystyrene, divinylbenzene, diisopropenylbenzene, o-chlorostyrene, m-chlorostyrene, p-chlorostyrene, 1,1-diphenylethyrene, N,N'-dimethyl-p-aminostyrene, N,N'-diethyl-p-aminostyrene, o-hydroxystyrene, m-hydroxy-styrene, p-hydroxystyrene, o-hydroxy-α-methylstyrene, m-hydroxy-α-methylstyrene, p-hydroxy-α-methylstyrene, p-vinylbenzyl alcohol and vinylpyridine;

unsaturated nitriles, such as acrylonitrile and methacrylonitrile, α-chloroacrylonitrile, α-chloromethylacrylonitrile, α-methoxyacrylonitrile, α-ethoxyacrylonitrile, crotonic acid nitrile, cinnamic acid nitrile, itaconic acid dinitrile, maleic acid dinitrile and fumaric acid dinitrile;

alkyl acrylates and methacrylates, such as methyl acrylate and methacrylate, ethyl acrylate and methacrylate, n-propyl acrylate and methacrylate, i-propyl acrylate and methacrylate, n-butyl acrylate and methacrylate, i-butyl acrylate and methacrylate, sec-butyl acrylate and methacrylate, t-butyl acrylate and methacrylate, n-pentyl acrylate and methacrylate, n-hexyl acrylate and methacrylate, 2-ethylhexyl acrylate and methacrylate, n-octyl acrylate and methacrylate, lauryl acrylate and methacrylate, and stearyl acrylate and methacrylate;

unsaturated monocarboxylic acid esters, such as methyl crotonate, ethyl crotonate, n-propyl crotonate, n-butyl crotonate, methyl cinnamate, ethyl cinnamate, n-propyl cinnamate and n-butyl cinnamate;

unsaturated dicarboxylic acid diesters, such as dimethyl maleate, diethyl maleate, di-n-butyl maleate, di-n-hexyl maleate, di-n-octyl maleate, dimethyl fumarate, diethyl fumarate, di-n-butyl fumarate, di-n-hexyl fumarate, di-n-octyl fumarate, dimethyl itaconate, diethyl itaconate, di-n-butyl itaconate, di-n-hexyl itaconate, and di-n-octyl itaconate;

fluoroalkyl acrylates and methacrylates, such as 2,2,2-trifluoroethyl acrylate and methacrylate, 3,3,3,2,2-pentafluoropropyl acrylate and methacrylate, and 4,4,4,3,3,2,2-heptafluorobutyl acrylate and methacrylate;

mono- or diacrylates and mono- or dimethacrylates of alkylene glycols, such as ethylene glycol, 1,2-propanediol, 1,3-propanediol, 3-chloro-1,2-propanediol, 1,4-butanediol, 1,5-pentanediol and 1,6-hexanediol;

mono- or diacrylates and mono- or dimethacrylates of polyalkylene glycols (the number of alkylene glycol units being, for example, 2–23), such as polyethylene glycol and polypropylene glycol;

alkoxyalkyl acrylates and methacrylates, such as 2-methoxyethyl acrylate and methacrylate, 2-ethoxyethyl acrylate and methacrylate, 2-methoxypropyl acrylate and methacrylate, 2-ethoxypropyl acrylate and methacrylate, 3-methoxypropyl acrylate and methacrylate and 3-ethoxypropyl acrylate and methacrylate;

acrylates and methacrylates of alkoxypolyalkylene glycols (the number of alkylene glycol units being, for example, 2–23), such as methoxypolyethylene glycol, ethoxypolyethylene glycol, methoxypolypropylene glycol and ethoxypolypropylene glycol;

aryloxyalkyl acrylates and methacrylates, such as 2-phenoxyethyl acrylate and methacrylate, 2-phenoxypropyl acrylate and methacrylate, and 3-phenoxypropyl acrylate and methacrylate;

acrylates and methacrylates of aryloxypolyalkylene glycols (the number of alkylene glycol units being, for example, 2–23), such as phenoxypolyethylene glycol and phenoxypolypropylene glycol;

cyanoalkyl acrylates and methacrylates, such as 2-cyanoethyl acrylate and methacrylate, 2-cyanopropyl acrylate and methacrylate, and 3-cyanopropyl acrylate and methacrylate;

mono- or oligo-acrylates and methacrylates of polyhydric alcohols having 3 or more hydroxyl groups, such as glycerol, 1,2,4-butanetriol, pentaerythritol, trimethylolalkane (the carbon number of alkane being, for example, 1–3) and tetramethylolalkane (the carbon number of alkane being, for example, 1–3);

mono- or oligo-acrylates and methacrylates of polyalkylene glycol adducts (the number of alkylene glycol units being, for example, 2–23) of the above-mentioned polyhydric alcohols having 3 or more hydroxyl groups;

mono- or oligo-acrylates and methacrylates of cyclic polyols, such as 1,4-cyclohexanediol, 1,4-benzenediol and 1,4-bis(2-hydroxyethyl)benzene;

unsaturated monocarboxylic acid hydroxyalkyl esters, such as 2-hydroxyethyl crotonate, 2-hydroxypropyl crotonate, 3-hydroxypropyl crotonate, 2-hydroxyethyl cinnamate, 2-hydroxypropyl cinnamate and 3-hydroxypropyl cinnamate;

N-hydroxyalkyl derivatives of unsaturated monocarboxylic acid amides, such as N-hydroxymethylacrylamide and -methacrylamide, N-(2-hydroxyethyl)acrylamide and -methacrylamide, N,N-bis(2-hydroxyethyl)acrylamide and -methacrylamide, N-hydroxymethyl crotonic acid amide, N-(2-hydroxyethyl) crotonic aid amide, N-hydroxymethyl cinnamic acid amide, and N-(2-hydroxyethyl) cinnamic acid amide;

unsaturated alcohols, such as allyl and methallyl alcohol;

unsaturated monocarboxylic acids, such as acrylic and methacrylic acid, crotonic acid and cinnamic acid;

unsaturated carboxylic acids and acid anhydrides, such as maleic acid, maleic anhydride, fumaric acid, itaconic acid, itaconic anhydride, citraconic acid and mesaconic acid;

esters containing a free carboxyl group, such as monomethyl esters, monoethyl esters, mono-n-propyl esters, mono-n-butyl esters, mono-n-hexyl esters and mono-n-octyl esters of the above-mentioned unsaturated polycarboxylic acids;

nitriles containing a free carboxyl group, such as mononitriles of the above-mentioned unsaturated polycarboxylic acids;

amides containing a free carboxyl group, such as monoamides of the above-mentioned unsaturated polycarboxylic acids;

hydroxyalkyl esters containing a free carboxyl group, such as mono(2-hydroxyethyl ester), mono(2-hydroxypropyl ester) and mono(3-hydroxypropyl ester) of the above-mentioned unsaturated polycarboxylic acid;

N-hydroxyalkyl derivatives of free carboxyl group-containing amides of the above-mentioned unsaturated polycarboxylic acids;

esters containing a free carboxyl group, e.g., monoesters of non-polymerizable polycarboxylic acids, such as phthalic acid, succinic acid and adipic acid, with hydroxyl group-containing unsaturated compounds, such as allyl or methallyl alcohol and 2-hydroxyethyl acrylate and methacrylate;

dialkylaminoalkyl acrylates and methacrylates, such as dimethylaminomethyl acrylate and methacrylate, diethylaminomethyl acrylate and methacrylate, 2-dimethylaminoethyl acrylate and methacrylate, 2-diethylaminoethyl acrylate and methacrylate, 2-(di-n-propylamino)ethyl acrylate and methacrylate, 2-dimethylaminopropyl acrylate and methacrylate, 2-diethylaminopropyl acrylate and methacrylate, 2-di-n-propylamino)propyl acrylate and methacrylate, 3-dimethylaminopropyl acrylate and dimethacrylate, 3-diethylaminopropyl acrylate and emthacrylate, and 3-di-n-propylamino)propyl acrylate and methacrylate;

(dialkylaminoalkoxy)alkyl acrylates and methacrylates, such as 2-(2-dimethylaminoethoxy)ethyl acrylate and methacrylate, 2-(2-diethylaminoethoxy)ethyl acrylate and methacrylate, 2-(2-dimethylaminoethoxy)propyl acrylate and methacrylate, 2-(2-diethylaminoethoxy)propyl acrylate and methacrylate, 3-(2-dimethylaminoethoxy)propyl acrylate and methacrylate, and 3-(2-diethylaminoethoxy) propyl acrylate and methacrylate;

N-dialkylaminoalkyl derivatives of acrylamide or methacrylamide, such as N-dimethylaminomethyl-acrylamide an -methacrylamide, N-diethylaminomethyl-acrylamide and -methacrylamide, N-(2-dimethylaminoethyl)-acrylamide and -methacrylamide, N-(2-diethylaminoethyl)-acrylamide and -methacrylamide, N-(2-dimethylaminopropyl)-acrylamide and -methacrylamide, N-(2-diethylaminopropyl)-acrylamide and -methacrylamide, N-(3-dimethylaminopropyl)-acrylamide and -methacrylamide, and N-(3-diethylaminopropyl)-acrylamide and -methacrylamide;

epoxy group-containing unsaturated compounds, such as allyl glycidyl ether, glycidyl acrylate and methacrylate, and 3,4-oxycyclohexyl acrylate and methacrylate;

unsaturated amides or unsaturated imides, such as acrylamide, methacrylamide, N,N'-methylenebisacrylamide, N,N'-methylenebismethacrylamide, N,N'-ethylenebisacrylamide, N,N'-ethylnebismethacrylamide, N,N'-hexamethylenebisacrylamide, N,N'-hexamethylenebismethacrylamide, crotonic acid amide, cinnamic acid amide and maleimide; and vinyl chloride, vinyl acetate, dicyclopentadiene, ethylidenenorbornene, etc.

These photopolymerizable unsaturated monomers may be used each alone or as a mixture of two or more thereof.

In the present invention, the characteristic properties of the photosensitive resin composition and the characteristic properties thereof after being photo-cured may be easily controlled by appropriately selecting the photopolymerizable unsaturated monomer described above. For permitting easy control of these characteristic properties in wide ranges, however, it is preferable to use a compound having a carboxyl group as the photopolymerizable unsaturated monomer and to combine it with an amino group contained in the particulate copolymer (1).

The molar ratio of the carboxyl group to the amino group in such a combination is preferably not less than 0.1, more preferably 0.4–10. When the molar ratio of the carboxyl group to the amino group is less than 0.1, the water-developability of the resulting composition tends to be poor.

In the present invention, the photopolymerizable unsaturated monomer may be used each alone or as a mixture of two or more thereof.

The photopolymerizable unsaturated monomer may be use in any desired proportion according to the intended use of the photosensitive resin composition, and the fluidity of the composition can be designed, as desired, to range from wax-like or rubber-like solid to low viscosity liquid according to the amount of the photopolymerizable unsaturated monomer. However, the amount of the photopolymerizable unsaturated monomer to be used is preferably 5–1,000 parts by weight, more preferably 10–500 parts by weight, relative to 100 parts by weight of the particulate copolymer (1). When the amount of the photopolymerizable unsaturated monomer used is less than 5 parts by weight, the strength of the resulting composition tends to be low; when it is more than 1,000 parts by weight, the shrinkage of the composition after photo-curing tends to increase, the water resistance and the water-developability of the composition tend to consist together with difficulty, and the viscosity design of the composition tends to have a low degree of freedom.

(3) Photopolymerization Initiator

The photopolymerization initiator, one of the constituents of the photosensitive resin composition of the present invention, comprises at least one compound (hereinafter referred to as "photopolymerization initiator (A)") selected from the group consisting of the compounds represented by the formula (I) and the formula (II) described above.

In the formulas (I) and (II), the halogen atom denoted by X or Y may be, for example, a fluorine atom, chlorine atom and iodine atom.

The monovalent hydrocarbon group having 1–20 carbon atoms denoted by X or Y may be, for example, aliphatic alkyl groups, such as the methyl group, ethyl group, n-propyl group, i-propyl group, n-butyl group, i-butyl group, sec-butyl group, t-butyl group, n-pentyl group, n-hexyl group, n-heptyl group, n-octyl group, 2-ethylhexyl group, n-nonyl group, and n-decyl group;

alicyclic alkyl groups, such as the cyclopentyl group, cyclohexyl group, o-methylcyclohexyl group, m-methylcyclohexyl group, p-methylcyclohexyl group, p-ethylcyclohexyl group, p-n-propylcyclohexyl group, p-i-propylcyclohexyl group, p-n-butylcyclohexyl group, p-t-butylcyclohexyl group, cycloheptyl group and cyclooctyl group;

aryl groups, such as the phenyl group, o-methyl-phenyl group, m-methylphenyl group, p-methylphenyl group, p-ethylphenyl group, p-n-propylphenyl group, p-i-propylphenyl group, p-n-butylphenyl group, p-t-butylphenyl group and 1-naphthyl group; and aralkyl groups, such as the benzyl group, o-methylbenzyl group, m-methylbenzyl group, p-methylbenzyl group, p-ethylbenzyl group, p-n-propylbenzyl group, p-i-propylbenzyl group, p-n-butylbenzyl group, p-t-butylbenzyl group, phenethyl group, p-methylphenethyl group, p-ethylphenethyl group, p-n-propylphenethyl group, p-i-propylphenethyl group, p-n-butylphenethyl group and p-t-butylphenethyl group.

The alkoxyl group having 1–20 carbon atoms denoted by X or Y may be, for example, aliphatic alkoxyl groups, such as the methoxy group, ethoxy group, n-propoxy group, i-propoxy group, n-butoxy group, i-butoxy group, sec-butoxy group, t-butoxy group, n-pentyloxy group, n-hexyloxy group, n-heptyloxy group, n-octyloxy group, n-nonyloxy group, and n-decyloxy group;

alicyclic alkyloxy groups, such as the cyclopentyloxy group, cyclohexyloxy group, p-methylcyclohexyloxy group, p-ethylcyclohexyloxy group, p-n-propylcyclohexyloxy group, p-i-propylcyclohexyloxy group, p-n-butylcyclohexyloxy group and p-t-butylcyclohexyloxy group;

aryloxy groups, such as the phenoxy group, o-methylphenoxy group, m-methylphenoxy group, p-methylphenoxy group, p-ethylphenoxy group, p-n-propylphenoxy group, p-i-propylphenoxy group, p-n-butylphenoxy group and p-t-butylphenoxy group; and aralkyloxy groups, such as the benzyloxy group, o-methylbenzyloxy group, m-methylbenzyloxy group, p-methylbenzyloxy group, p-ethylbenzyloxy group, p-n-propylbenzyloxy group, p-i-propylbenzyloxy group, p-n-butylbenzyloxy group, p-t-butylbenzyloxy group and phenethyloxy group.

In the formulas (I) and (II), X and Y are each preferably a hydrogen atom, chlorine atom, methyl group, ethyl group, n-propyl group and i-propyl group.

In the present invention, the photopolymerization initiator (A) may be used either singly or as a mixture of two or more thereof.

In the present invention, other photopolymerization initiators may also be used together with the photopolymerization initiator (A).

The above-mentioned other photopolymerization initiator may be, for example, α-diketones, such as diacetyl and benzil; acyloins, such as benzoin and pivaloin; acyloin ethers, such as benzoin methyl ether, benzoin ethyl ether and benzoin n-propyl ether; polynuclear quinones, such as anthraquinone and 1,4-naphthoquinone; acetophenones, such as 2,2-dimethoxy-2-phenylacetophenone and trichloroacetophenone; and benzophenones, such as benzophenone and methyl o-benzoylbenzoate.

These other photopolymerization initiators may be used each alone or as a mixture of two or more thereof.

The proportion of the other photopolymerization initiator to be used is preferably not more than 50% by weight, more preferably not more than 30% by weight, relative to the total of the photopolymerization initiator (A) and the other photopolymerization initiator. When the proportion of the other photopolymerization initiator used is higher than 50% by weight, the resulting composition is liable to fail, particularly in the hardness and resilience intended in the present invention, in obtaining the desired effects.

The amount of the photopolymerization initiator to be used is preferably 0.1–20 parts by weight, more preferably 1–10 parts by weight, relative to 100 parts by weight of the particulate copolymer (1). When the amount of the photopolymerization initiator used is less than 0.1 part by weight, the resulting composition tends to cure insufficiently. When the amount is more than 20 parts by weight, on the other hand, it is uneconomical because not all of the photopolymerization initiator can participate in the reaction; moreover, in such a large amount, the initiator is sometimes insufficiently compatible with the particulate copolymer (1) and the photopolymerizable unsaturated monomer (2), resulting in a composition of a poor dispersion.

Other Additives

The photosensitive resin composition of the present invention may be incorporated, for the purpose of further improving its water-developability, with a nonpolymerizable polar compound having at least one functional group selected from the group consisting of the carboxyl group, hydroxyl group and epoxy group in the range of amount not exceeding 20% by weight relative to the whole composition.

Examples of the above-mentioned non-polymerizable polar compound include carboxylic acids, such as formic acid, acetic acid and propionic acid; alcohols, such as methanol, ethanol, n-propanol, n-butanol, triethanol and tripropanol; and epoxy compounds, such as 1,2-epoxybutane and 1,2-epoxyhexane.

These nonpolymerizable polar compounds may be used each alone or as a mixture of two or more thereof.

The photosensitive resin composition of the present invention may be incorporated, if necessary and desired for the purpose of enhancing the efficiency of the photopolymerization initiator (3), with an accelerator in the range of amount not exceeding 10% by weight relative to the whole composition.

Examples of the accelerator include tertiary amino compounds, such as triethanolamine, methyldiethanolamine, tri-i-propanolamine, methyl p-dimethylaminobenzoate, ethyl p-dimethylaminobenzoate, i-pentyl p-dimethylaminobenzoate, 2-ethylhexyl p-dimethylaminobenzoate, 2-dimethylaminoethyl benzoate, 2-n-butoxyethyl p-dimethylaminobenzoate, 4,4'-dimethylaminobenzophenone and 4,4'-diethylaminobenzophenone.

These accelerators may be used each alone or as a mixture of two or more thereof.

The photosensitive resin composition of the present invention may be incorporated, according to necessity, with conventional additives, e.g., a thermal addition polymerization inhibitor, in the range of amount not exceeding 2% by weight relative to the whole composition.

Examples of the thermal addition polymerization inhibitor include hydroxyaromatic compounds, such as hydroquinone, hydroquinone monomethyl ether, hydroquinone mono-t-butyl ether, catechol, p-methoxyphenol, p-t-butylcatechol, 2,6-di-t-butyl-p-cresol, 2,6-di-t-butyl-p-cresol, 2,6-di-t-butyl-m-cresol, pyrogallol and β-naphthol; quinones, such as benzoquinone, 2,5-diphenyl-p-benzoquinone, p-toluquinone and p-xyloquinone; nitro compounds or nitron compounds, such as nitrobenzene, m-dinitrobenzene, 2-methyl-2-nitropropane, α-phenyl-t-butylnitron and 5,5-dimethyl-2-pyrroline-1-oxide; amines, such as chloranil/amine system, phenol/1-naphthylamine system, diphenylamine, diphenylpicrylhydrazine, pyridine and phenothiazine; sulfides, such as dithiobenzoyl sulfide and dibenzyl tetrasulfide; unsaturated compounds, such as 1,1-diphenylethylene and α-methylthioacrylonitrile; thiazine dyes, such as Thionine Blue, Toluidine Blue and Methylene Blue; and stable radicals, such as 1,1-diphenyl-2picrylhydrazyl, 1,3,5-triphenylpheldazyl, 4-hydroxy-2,2,6,6-tetramethylpiperidine-1-oxyl and 2,6-di-t-butyl-α-(3,5-di-t-butyl)-4-oxo-2,5-cyclohexadien-1-ylidene-p-trioxyl.

These thermal addition polymerization inhibitors may be used each alone or as a mixture of two or more thereof.

Further, the photosensitive resin composition of the present invention may be incorporated, for the purpose of enhancing the strength of the resulting composition, according to necessity, with a block copolymer comprising a hard segment and a soft segment as the main components wherein the hard segment is a thermoplastic non-elastomeric polymer segment having a glass transition temperature (Tg) not lower than 20° C. and the soft segment is an aliphatic conjugated diene-based elastomeric polymer having a glass transition temperature not higher than 10° C. The amount of the block copolymer to be incorporated is 30–500 parts by weight relative to 100 parts by weight of the particulate copolymer (1). The hard segment of the block copolymer is preferably a polymer constituted essentially of the units of at least one monomer selected from the group consisting of styrene, t-butylstyrene, α-methylstyrene, p-methylstyrene, N,N-dimethyl-p-aminoethylstyrene, N,N-diethyl-p-aminoethylstyrene, 1,1-diphenylstyrene, divinylbenzene and vinylpyridine. The soft segment of the black copolymer is preferably a polymer constituted essentially of the units of at least one monomer selected from the group consisting of 1,3-butadiene, isoprene, 2,3-dimethyl-1,3-butadiene, 1,3-pentadiene, 2-methyl-1,3-pentadiene, 1,3-hexadiene, 4,5-diethyl-1,3-octadiene, 3-butyl-1,3-octadiene and chloroprene.

The above-mentioned block copolymer may also be used after having, by hydrogenation of the unsaturated double bond originating from the aliphatic conjugated diene monomer constituting the soft segment, the content of the unsaturated double bond remaining in the soft segment after the hydrogenation reduced to 30% by mole in one molecule.

As typical examples of such block copolymers, there may be mentioned, in trade names JSR TR 2000 (a styrene-butadiene based thermoplastic elastomer), JSR SIS 5000 (a styrene-isoprene based thermoplastic elastomer) and JSR DYNARON 1320P (a hydrogenated polymer).

These block copolymers may be used each alone or as a mixture of two or more thereof.

Preparation and use of Photosensitive Resin Composition

The photosensitive resin composition of the present invention is prepared by throughly kneading the particulate copolymer (1), the photopolymerizable unsaturated monomer (2) and the photopolymerization initiator (3), together with optionally added other ingredients, for example with warming, by using a kneader, intermixer or the like. The photosensitive resin composition thus obtained can be designed as desired to range from a wax-like or rubber-like solid deficient in fluidity to a low viscosity liquid having an excellent fluidity.

The photosensitive resin composition deficient in fluidity can be worked up into a photosensitive resin plate having a specified thickness by forming the composition into a specified film thickness by using a spacer having an appropriate thickness, or coating the composition on a base material by means of a roll coater or the like, or by compression molding, extrusion molding and the like. A printing plate can be obtained by applying a negative film onto the photosensitive resin plate thus prepared, followed by exposure to light, and then washing away the unexposed part with water.

Further, the photosensitive resin composition having an excellent fluidity can be used, after its viscosity has been controlled according to necessity by addition of an appropriate solvent, as a resist suitable, for example, for spin coating. This resist also can be used to form a distinct resist pattern by exposing it to light and then washing away the unexposed part with water, in the same manner as described above.

The photosensitive resin composition of the present invention has an excellent water-developability, gives an excellent resin plate strength after light exposure, has a low hardness and excellent resilience, gives a resin plate with a good transparency, and is thus excellent in balance of characteristic properties. Moreover, the present composition can be designed as desired to range from a wax-like or subber-like sold deficient in fluidity to a low viscosity liquid having an excellent fluidity, and also has a good processability.

Accordingly, the photosensitive resin composition of the present invention can be used quite favorably as a material for photosensitive printing plates and photoresist; moreover the composition is useful as a photosensitive material in a wide technical field, e.g., for photosensitive ink, photosensitive paint, photosensitive adhesive and photo-molding materials.

DESCRIPTION OF PREFERRED EMBODIMENTS

The present invention is described in more detail below with reference to Examples, but the invention is in no way limited thereto.

EXAMPLE 1

Preparation of Particulate Copolymer (1)

An emulsion polymerization was carried out by using sodium lauryl sulfate as an emulsifier, benzoyl peroxide as a polymerization initiator, and a monomer mixture comprising butadiene, 2-diethylaminoethyl methacrylate, ethylene glycol dimethacrylate and methyl methacrylate in a proportion, in the above-mentioned order (the same applies hereinafter), of 80:6.5:1.0:12.5 (% by mole), then the resulting copolymer emulsion was coagulated by salting out with calcium chloride and dried to obtain a particulate copolymer (1). The conversion in the polymerization was approximately 100%.

Preparation of Photosensitive Resin Composition

To 100 parts by weight of the particulate copolymer (1) obtained above were added 30 parts by weight of lauryl methacrylate, 5 parts by weight of 1,6-hexanediol diacrylate and 20 parts by weight of mono(2-acryloytloxyethyl) succinate, each as a photopolymerizable unsaturated monomer (2), 1 part by weight of 9-fluorenone as a photopolymerization initiator (3), 0.5 part by weight of t-butylcatechol as a storage stabilizer and 30 parts by weight of SIS5000 as a block copolymer, and the resulting mixture was stirred for 30 minutes in a kneader conditioned at 50° C., to obtain the photosensitive resin composition of the present invention. The composition was in the form of a transparent wax.

EVALUATION

A photosensitive resin plate of 0.5 mm thickness was formed on a polyester sheet by using the photosensitive resin composition obtained above. The resin plate thus obtained was subjected to brushing in a warm water at 30° C.by using a developing machine (Type JOW-A-4P, mfd. by JAPAN ELECTRONIC MACHINE CO. (Nihon Denshi Seiki K.K.) to determine the time required until disappearance of the photosensitive resin layer (said time being hereinafter referred to as "necessary dissolution time").

Separately, the photosensitive resin plate was cured by exposing it to light for 6 minutes by using a light exposing machine (JE-A3-SS, a trade name, mfd. by JAPAN ELECTRONIC MACHINE CO.) and then determined for its tensile strength, elongation at break, resilience and hardness according to JIS K 6301.

The results thus obtained are shown in Table 1.

These results reveal that the photosensitive resin composition is excellent in water-developability and resin plate strength, has a low hardness and excellent resilience, gives a resin plate with a good transparency, and thus has excellently balanced characteristic properties.

EXAMPLE 2

Preparation of Particulate Copolymer (1)

A particulate copolymer (1) was prepared in the same manner as in Example 1 except for using a monomer mixture comprising butadiene, 2-dimethylaminoethyl methacrylate, divinylbenzene and methyl methacrylate in a proportion of 80:6.5:1.0:12.5 (% by mole). The conversion in the polymerization was approximately 100%.

Preparation and Evaluation of Photosensitive Resin Composition

To 100 parts by weight of the particulate copolymer (1) obtained above were added 30 parts by weight of lauryl methacrylate, 5 parts by weight of 1,6-hexanediol diacrylate and 20 parts by weight of acrylic acid, each as a photopolymerizable unsaturated monomer (2), 1 part by weight of 2-i-propylthioxanthone as a photopolymerization initiator (3), 0.5 part by weight of t-butylcatechol as a storage stabilizer and 30 parts by weight of SIS 5000 as a block copolymer, and the resulting mixture was treated in the same manner as in Example 1 to prepare the photosensitive resin composition of the present invention. The composition was in the form of a transparent wax.

The photosensitive resin composition obtained above was evaluated in the same manner as in Example 1. The results of evaluation are shown in Table 1.

These results reveal that the photosensitive resin composition is excellent in water-developability and resin plate strength, has a low hardness and excellent resilience, gives a resin plate with a good transparency, and thus has excellently balanced characteristic properties.

13

EXAMPLE 3

Preparation of Particulate Copolymer (1)

A particulate copolymer (1) was prepared in the same manner as in Example 1 except for using a monomer mixture comprising butadiene, 2-diethylaminoethyl methacrylate, divinylbenzene and styrene in a proportion of 80:6.5:1.0:12.5 (% by mole). The conversion in the polymerization was approximately 100%.

Preparation and Evaluation of Photosensitive Resin Composition

The same treatment as in Example 1 was applied except for using the particulate copolymer (1) obtained above, to prepare the photosensitive resin composition of the present invention. The composition was in the form of a transparent wax.

The photosensitive resin composition thus obtained was evaluated in the same manner as in Example 1. The results thus obtained are shown in Table 1.

These results reveal that the photosensitive resin composition is excellent in water-developability and resin plate strength, has a low hardness and excellent resilience, gives resin plate with a good transparency and thus has excellently balanced characteristic properties.

Comparative Example 1

Preparation of Particulate Copolymer

A particulate copolymer was prepared in the same manner as in Example 1 except for using a monomer mixture comprising butadiene, methacrylic acid, ethylene glycol dimethacrylate and methyl methacrylate in a proportion of 80:6.5:1.0:12.5 (% by mole). The conversion in the polymerization was approximately 100%.

Preparation and Evaluation of Photosensitive Resin Composition

To 100 parts by weight of the particulate copolymer obtained above were added 30 parts by weight of lauryl methacrylate, 5 parts by weight of 1,6-hexanediol diacrylate and 20 parts by weight of N-(2-dimethylaminopropyl)acrylamine, each as a photopolymerizable unsaturated monomer (2), 1 part by weight of 9-fluorenone as a photopolymerization initiator (3), 0.5 part by weight of t-butylcatechol as a storage stabilizer and 30 parts by weight of SIS5000 as a block copolymer, and the resulting mixture was treated in the same manner as in Example 1 to prepare a photosensitive resin composition. The resin composition obtained above was in the form of a transparent wax.

The photosensitive resin composition thus obtained was evaluated in the same manner as in Example 1. The results thus obtained are shown in Table 1.

These results reveal that the photosensitive resin composition is poor in water-developability and resin plate strength and has a high hardness and poor resilience.

Comparative Example 2

The same procedures as in Example 1 were followed except for using 2,2-dimethoxy-2-phenylacetophenone as a photopolymerization initiator, to prepare a photosensitive resin composition. The resin composition was in the form of a transparent wax.

The photosensitive resin composition obtained above was evaluated in the same manner as in Example 1. The results thus obtained are shown in Table 1.

These results reveal that the photosensitive resin composition is poor in resin plate strength and has a high hardness and poor resilience.

EXAMPLE 4

Preparation of Particulate Copolymer (1)

A particulate copolymer (1) was prepared in exactly the same manner as in Example 1.

Preparation of Photosensitive Resin Composition

To 100 parts by weight of the particulate copolymer (1) obtained above were added 45 parts by weight of lauryl methacrylate and 5 parts by weight of 1,6-hexanediol diacrylate, each as a photopolymerizable unsaturated monomer (2), 1 part by weight of 9-fluorenone as a photopolymerization initiator (3), 0.5 part by weight of t-butylcatechol as a storage stabilizer and 30 parts by weight of a styrene-isoprene-styrene block copolymer (JSR SIS5000, a trade name, mfd. by JSR Co.) as a block copolymer, and the resulting mixture was stirred for 30 minutes in a kneader conditioned at 50° C., to prepare the photosensitive resin composition of the present invention. The resin composition was in the form of a transparent wax.

EVALUATION

A photosensitive resin plate of 0.5 mm thickness was formed on a polyester sheet by using the photosensitive resin composition obtained above. The resin plate thus obtained was a subjected to brushing in a 1% aqueous lactic acid solution at 30° C. by using a developing machine (Type JOW-A-4P, mfd. by JAPAN ELECTRONIC MACHINE CO.) to determine the time required until disappearance of the photosensitive resin layer (necessary dissolution time). Separately, the photosensitive resin plate was cured by exposing it to light for 6 minutes by using a light exposing machine (JE-A3-SS, a trade name, mfd. by JAPAN ELECTRONIC MACHINE CO.) and then determined for its tensile strength, elongation at break, resilience and hardness according to JIS K6301. The results thus obtained are shown in Table 1. These results reveal that the photosensitive resin composition is excellent in water-developability and resin plate strength, has a low hardness and excellent resilience, gives a resin plate with a good transparency, and has thus excellently balanced characteristic properties.

EXAMPLE 5

Preparation of Particulate Copolymer (1)

A particulate copolymer (1) was prepared in exactly the same manner as in Example 1.

Preparation of Photosensitive Resin Composition

To 100 parts by weight of the particulate copolymer (1) obtained above were added 30 parts by weight of lauryl methacrylate, 5 parts by weight of 1,6-hexanediol diacrylate and 20 parts by weight of mono(2-acryloyloxyethyl)succinate, each as a photopolymerizable unsaturated monomer (2), 1 part by weight of 9-fluorenone as a photopolymerization initiator (3), 0.5 part by weight of t-butylcatechol as a storage stabilizer and 30 parts by weight of a styrene-butadiene-styrene block copolymer (JSR TR2000, a trade name, mfd. by JSR Co.) as a block copolymer, and the resulting mixture was stirred for 30 minutes in a kneader conditioned at 50° C., to prepare the photosensitive resin composition of the present invention. The resin composition was in the form of a transparent wax.

EVALUATION

A photosensitive resin plate of 0.5 mm thickness was formed on a polyester sheet by using the photosensitive resin composition obtained above. The resin plate thus obtained was subjected to brushing in a warm water at 30° C. by using a developing machine (Type JOW-A-4P, mfd. by JAPAN ELECTRONIC MACHINE CO.) to determine the time required until disappearance of the photosensitive resin layer (necessary dissolution time). Separately, the photosensitive resin plate was cured by exposing it to light for 6 minutes by using a light exposing machine (JE-A3-SS, a trade name, mfd. by JAPAN ELECTRONIC MACHINE CO.) and then determined for its tensile strength, elongation at break, resilience and hardness according to JIS K6301. The results thus obtained are shown in Table 1. These results reveal that the photosensitive resin composition is excellent in water-developability and resin plate strength, has a low hardness and excellent resilience, gives a resin plate with a good transparency and thus has excellently balanced characteristic properties.

EXAMPLE 6

Preparation of Particulate Copolymer (1)

A particulate copolymer (1) was prepared in exactly the same manner as in Example 1.

Preparation of Photosensitive Resin Composition

To 100 parts by weight of the particulate copolymer (1) obtained above were added 30 parts by weight of lauryl methacrylate, 5 parts by weight of 1,6-hexanediol diacrylate and 20 parts by weight of mono(2-acryloxyloxyethyl) succinate, each as a photopolymerizable unsaturated monomer (2), 1 part by weight of 9-fluorenone as a photopolymerization initiator (3), 0.5 part of t-butylcatechol as a storage stabilizer and 30 parts by weight of a hydrogenation product (SEPTON 2043, a trade name, mfd. by KURARAY Co., Ltd.) of styrene-isoprene-styrene block copolymer as a block copolymer, and the resulting mixture was stirred for 30 minutes in a kneader conditioned at 50° C. to prepare the photosensitive resin composition of the present invention. The resin composition was in the form of a transparent wax.

EVALUATION

A photosensitive resin plate of 0.5 mm thickness was formed on a polyester sheet by using the photosensitive resin composition obtained above. The resin plate thus obtained was subjected to brushing in a warm water at 30° C. by using a developing machine (Type JOW-A-4P, mfd. by JAPAN ELECTRONIC MACHINE CO.) to determine the time required until disappearance of the photosensitive resin layer (necessary dissolution time). Separately, the photosensitive resin plate was cured by exposing it to light for 6 minutes by using a light exposing machine (JE-A3-SS, a trade name, mfd. by JAPAN ELECTRONIC MACHINE CO.) and then determined for its tensile strength, elongation at break, resilience and hardness according to JIS K6301. The results thus obtained are shown in Table 1. These results reveal that the photosensitive resin composition is excellent in water-developability and resin plate strength, has a low hardness and excellent resilience, gives a resin plate with a good transparency and thus has excellently balanced characteristic properties.

EXAMPLE 7

Preparation of Particulate Copolymer (1)

A particulate copolymer (1) was prepared in exactly the same manner as in Example 1.

Preparation of Photosensitive Resin Composition

To 100 parts by weight of the particulate copolymer (1) obtained above were added 30 parts by weight of lauryl methacrylate, 5 parts by weight of 1,6-hexanediol diacrylate and 20 parts by weight of mono(2-acryloyloxyethyl) succinate, each as a photopolymerizable unsaturated monomer (2), 1 part by weight of 9-fluorenone as a photopolymerization initiator (3), 0.5 part by weight of t-butylcatechol as a storage stabilizer and 100 parts by weight of a styrene-isoprene-styrene block copolymer (JSR SIS5000, a trade name, mfd. by JSR Co.) as a block copolymer. The resulting mixture was stirred for 60 minutes in a kneader conditioned at 50° C., to prepare the photosensitive resin composition of the present invention. The resin composition was in the form of a transparent wax.

EVALUATION

A photosensitive resin plate of 0.5 mm thickness was formed on a polyester sheet by using the photosensitive resin composition obtained above. The resin plate was subjected to brushing in a warm water at 30° C. by using a developing machine (Type JOW-A-4P, mfd. by JAPAN ELECTRONIC MACHINE CO.) to determine the time required until disappearance of the photosensitive resin layer (necessary dissolution time). Separately, the photosensitive resin plate was cured by exposing it to light for 6 minutes by using a light exposing machine (JE-3S-SS, a trade name, mfd. by JAPAN ELECTRONIC MACHINE CO.) and then determined for its tensile strength, elongation at break, resilience and hardness according to JIS K6301. The results thus obtained are shown in Table 1. These results reveal that the photosensitive resin composition is good in water-developability and excellent in resin plate strength, has a low hardness and excellent resilience, gives a resin plate with a good transparency and thus has excellently balanced characteristic properties.

TABLE 1

| | Example | | | | | | | Comparative Example | |
|---|---|---|---|---|---|---|---|---|---|
| Photosensitive resin composition | 1 | 2 | 3 | 4 | 5 | 6 | 7 | 1 | 2 |
| Particulate copolymer (part by weight) | | | | | | | | | |
| Copolymer composition (mol %) | 100 | 100 | 100 | 100 | 100 | 100 | 100 | 100 | 100 |
| ① Butadiene | 80 | 80 | 80 | 80 | 80 | 80 | 80 | 80 | 80 |
| ② N,N-Diethylaminoethyl methacrylate | 6.5 | | 6.5 | 6.5 | 6.5 | 6.5 | 6.5 | | 6.5 |
| N,N-Dimethylaminoethyl methacrylate | | 6.5 | | | | | | | |
| Methacrylic acid | | | | | | | | 6.5 | |
| ③ Ethylene glycol dimethacrylate | 1.0 | | 1.0 | 1.0 | 1.0 | 1.0 | 1.0 | 1.0 | 1.0 |
| Divinylbenzene | | 1.0 | | | | | | | |

TABLE 1-continued

| Photosensitive resin composition | Example 1 | 2 | 3 | 4 | 5 | 6 | 7 | Comparative Example 1 | 2 |
|---|---|---|---|---|---|---|---|---|---|
| (4) Methyl methacrylate | 12.5 | 12.5 | | 12.5 | 12.5 | 12.5 | 12.5 | 12.5 | 12.5 |
| Styrene | | | 12.5 | | | | | | |
| Photopolymerizable unsaturated monomer (part by weight) | | | | | | | | | |
| Lauryl methacrylate | 30 | 30 | 30 | 45 | 30 | 30 | 30 | 30 | 30 |
| 1,6-Hexamediol diacrylate | 5 | 5 | 5 | 5 | 5 | 5 | 5 | 5 | 5 |
| Mono(2acryloyloxyethyl)succinate | 20 | | 20 | | 20 | 20 | 20 | | 20 |
| Acrylic acid | | 20 | | | | | | | |
| N,N-Dimethylaminopropyl acrylamide | | | | | | | | 20 | |
| Photopolymerization initiator (part by weight) | | | | | | | | | |
| 9-Fluorenone | 1 | | 1 | 1 | 1 | 1 | 1 | 1 | |
| 2-i-Propylthioxanthone | | 1 | | | | | | | |
| 2,2-Dimethoxy-2-phenylacetophenone | | | | | | | | | 1 |
| Other additive (part by weight) | | | | | | | | | |
| P-t-Butylcatechol | 0.5 | 0.5 | 0.5 | 0.5 | 0.5 | 0.5 | 0.5 | 0.5 | 0.5 |
| SIS5000 (*1) | 30 | 30 | 30 | 30 | | | 100 | 30 | 30 |
| TR2000 (*2) | | | | | 30 | | | | |
| SEPTON2024 (*3) | | | | | | 30 | | | |
| Evaluation Necessary dissolution time (sec) | 250 | 240 | 230 | 250 | 240 | 250 | 600 | 260 | 250 |
| Tensile strength (Mpa) | 2.4 | 2.6 | 2.3 | 2.7 | 2.5 | 2.3 | 4.0 | 2.0 | 2.1 |
| Elongation at break (%) | 105 | 100 | 115 | 120 | 115 | 120 | 180 | 100 | 95 |
| Resilience (%) | 52 | 49 | 54 | 55 | 52 | 53 | 45 | 40 | 29 |
| Hardness (JIS-A) | 52 | 53 | 50 | 50 | 52 | 49 | 55 | 58 | 63 |

Note:
(*1) Styrene-isoprene based thermplastic elastomer
(*2) Styrene-butadiene based thermoplastic elastomer
(*3) Hydrogenation product of styrene-isoprene based thermoplastic elastomer

What is claimed is:

1. A photosensitive resin composition which comprises (1) a particulate copolymer comprising, as the repeating units in the copolymer, 10–99.8% by mole of the unit of (i) an aliphatic conjugated diene monomer, 0.1–30% by mole of the unit of (ii) a monomer having one polymerizable unsaturated group and an amino group, 0.1–20% by mole of the unit of (iii) a monomer having at least two polymerizable unsaturated groups and 0–40% by mole of the unit of (iv) a copolymerizable other monomer having one polymerizable unsaturated group, the total of the units of monomers (i), (ii), (iii) and (iv) being 100% by mole, (2) a photopolymerizable unsaturated monomer and (3) at least one photopolymerization initiator selected from the group of the compounds represented by the following formulas (I) and (II),

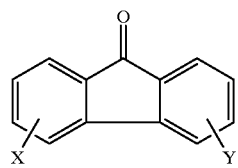

(I)

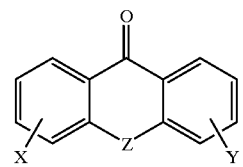

(II)

wherein X and Y are each independently a hydrogen atom, halogen atom, carboxyl group, monovalent hydrocarbon group having 1–20 carbon atoms or alkoxyl group having 1–20 carbon atoms and Z is an oxygen atom or sulfur atom.

2. The composition according to claim 1 wherein the amino group in the monomer (ii) having one polymerizable unsaturated group and an amino group is a tertiary amino group.

3. The composition according to claim 1 wherein the particulate copolymer (1) is a particulate copolymer having a particle diameter of 20–500 nm.

4. The composition according to claim 1 which comprises 10–500 parts by weight of the photopolymerizable unsaturated monomer (2) relative to 100 parts by weight of the particulate copolymer (1).

5. The composition according to claim 1 which comprises 0.1–20 parts by weight of the photopolymerization initiator (3) relative to 100 parts by weight of the particulate copolymer (1).

6. The composition according to claim 1 wherein the photopolymerization initiator (3) is at least one member selected from the group consisting of 9-fluorenone and 2-isopropyl-9H-thioxanthen-9-one.

7. A photosensitive resin composition which comprises components (1), (2) and (3) which are respectively the same as in claim 1, and (4) a block copolymer comprising a hard segment and a soft segment as the main components wherein the hard segment is a thermoplastic non-elastomeric polymer segment having a Tg not lower than 20° C. and the soft segment is an aliphatic conjugated diene-based elastomeric polymer or a hydrogenated aliphatic conjugated diene-based elastomeric polymer segment having a Tg not higher than 10° C.

8. The composition according to claim 7 which comprises 30–500 parts by weight of the block copolymer (4) relative to 100 parts by weight of the particulate copolymer (1).

9. The composition according to claim 7 wherein the hard segment of the block copolymer (4) is a polymer constituted essentially of the unit of at least one monomer selected from the group consisting of styrene, t-butylstyrene, α-methylstyrene, p-methylstyrene, N,N-dimethyl-p-aminoethylstyrene, N,N-diethyl-p-aminoethylstyrene, 1,1-diphenylstyrene, divinylbenzene and vinyl-pyridine.

10. The composition according to claim 7 wherein the soft segment of the block copolymer (4) is a polymer constituted essentially of the unit of at least one monomer selected from the group consisting of 1,3-butadiene, isoprene, 2,3-dimethyl-1,3-butadiene, 1,3-pentadiene, 2-methyl-1,3-pentadiene, 1,3-hexadiene, 4,5-diethyl-1,3-octa-diene, 3-butyl-1,3-octadiene and chloroprene, or a hydrogenated polymer thereof.

11. The composition according to claim 7 wherein the amino group in the monomer (ii) having one polymerizable unsaturated group and an amino group is a tertiary amino group.

12. The composition according to claim 7 wherein the particulate copolymer (1) is a particulate copolymer having particle diameters of 20–500 nm.

13. The composition according to claim 7 which comprises 10–500 parts by weight of the photopolymerizable unsaturated monomer (2) relative to 100 parts by weight of the particulate copolymer (1).

14. The composition according to claim 7 which comprises 0.1–20 parts by weight of the photopolymerization initiator (3) relative to 100 parts by weight of the particulate copolymer (1).

15. The composition according to claim 7 wherein the photopolymerization initiator is at least one member selected from the group consisting of 9-fluorenone and 2-isopropyl-9H-thioxanthen-9-one.

* * * * *